(12) United States Patent
Huang et al.

(10) Patent No.: US 8,452,558 B2
(45) Date of Patent: May 28, 2013

(54) TEST CIRCUIT FOR TESTING FLEXIBLE PRINTED CIRCUIT

(75) Inventors: Yuan-Fa Huang, Shenzhen (CN); Peng-Wei Gu, Shenzhen (CN); Wen-Juan Ning, Shenzhen (CN); Yu-Zhe Geng, Shenzhen (CN); Jia Chen, Shenzhen (CN); De-Ke Ma, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 240 days.

(21) Appl. No.: 12/953,478

(22) Filed: Nov. 24, 2010

(65) Prior Publication Data

US 2012/0059611 A1 Mar. 8, 2012

(30) Foreign Application Priority Data

Sep. 7, 2010 (CN) .......................... 2010 1 0274595

(51) Int. Cl.
| | | |
|---|---|---|
| *G01R 25/00* | (2006.01) | |
| *G01R 27/00* | (2006.01) | |
| *G01R 31/00* | (2006.01) | |
| *G01R 31/14* | (2006.01) | |

(52) U.S. Cl.
USPC ........................................... 702/65; 702/117

(58) Field of Classification Search
USPC .................................................. 702/65, 117
See application file for complete search history.

(56) References Cited

U.S. PATENT DOCUMENTS

| | | | | | |
|---|---|---|---|---|---|
| 4,714,875 | A | * | 12/1987 | Bailey et al. .................. | 324/73.1 |
| 5,043,910 | A | * | 8/1991 | Chiba ............................ | 716/136 |
| 5,323,137 | A | * | 6/1994 | Kimura et al. ................ | 338/196 |
| 5,744,964 | A | * | 4/1998 | Sudo et al. .................... | 324/537 |
| 6,333,633 | B1 | * | 12/2001 | Honjo et al. .................. | 324/537 |
| 7,199,603 | B2 | * | 4/2007 | Simons ............................. | 326/8 |

FOREIGN PATENT DOCUMENTS

SU         595746      * 3/1978

OTHER PUBLICATIONS

English Abstract of SU 595746, Mar. 1978.*

* cited by examiner

*Primary Examiner* — Michael Nghiem
(74) *Attorney, Agent, or Firm* — Altis Law Group, Inc.

(57) ABSTRACT

A test circuit for testing a flexible printed board (FPC) is provided, the test circuit includes a parameter preset module, a comparison module, and a prompt module. The parameter preset module is used to preset a parameter range indicating the suitable range of the resistance value of the FPC, and is further configured to connect to the FPC and convert the resistance value of the FPC to a related parameter. The comparison module compares the related parameter with the parameter range preset by the parameter preset module, and produces a comparison result. The prompt module produces a corresponding prompt signal according to the comparison result.

10 Claims, 3 Drawing Sheets

TEST CIRCUIT FOR TESTING FLEXIBLE PRINTED CIRCUIT

BACKGROUND

1. Technical Field

The present disclosure relates to test circuits, particularly to a test circuit for testing flexible printed circuits.

2. Description of Related Art

Nowadays, flexible printed circuits (FPCs) are applied in many electronic devices, such as mobile phones, digital cameras, and digital photo frames. In order to guarantee the quality of the electronic devices, a test for the FPC is needed before manufacturing is completed. An important test item is to test whether the resistance value of the FPC is in a suitable range, the usual method to test the resistance value of the FPC is to use a special testing device. However, the special testing device is expensive.

Therefore, it is desirable to provide a test circuit to overcome the above-mentioned limitations.

BRIEF DESCRIPTION OF THE DRAWINGS

Many aspects of the present disclosure should be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Embodiments of the present disclosure will now be described in detail below, with reference to the accompanying drawings.

Figure 1:
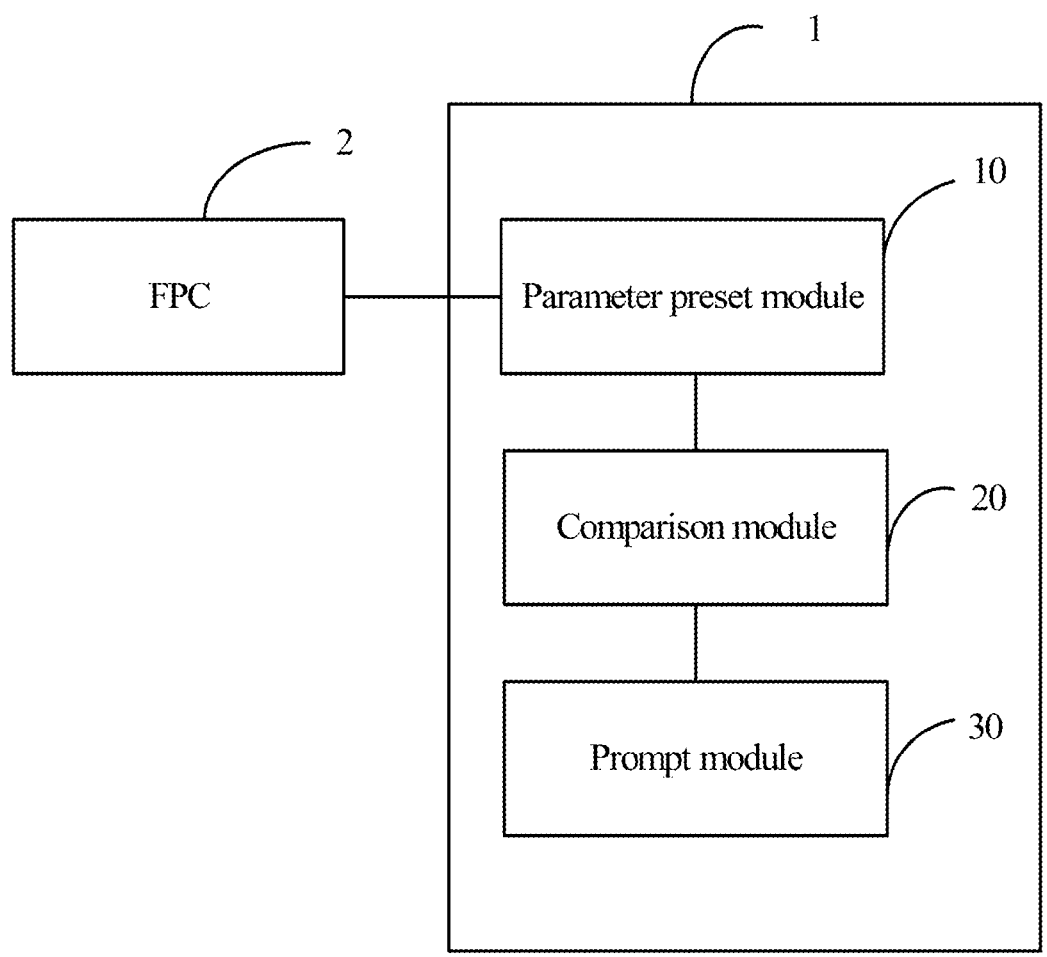
FIG. 1 is a block diagram of a test circuit for testing flexible printed circuits, in accordance with an exemplary embodiment.

Referring to FIG. 1, a test circuit 1 capable of testing a resistance value of a flexible printed circuit (FPC) 2, in accordance with an exemplary embodiment, is provided. The test circuit 1 includes a parameter preset module 10, a comparison module 20, and a prompt module 30. The parameter preset module 10 is used to preset a parameter range indicating a suitable range of resistance value of the FPC 2, and is used to connect to the FPC 2 and convert the resistance value of the FPC 2 to a related parameter. The comparison module 20 compares the related parameter with the parameter range, and produces a comparison result. The prompt module 30 produces a corresponding prompt signal according to the comparison result. In the embodiment, the comparison result includes that the related parameter is within the parameter range or not.

Figure 2:
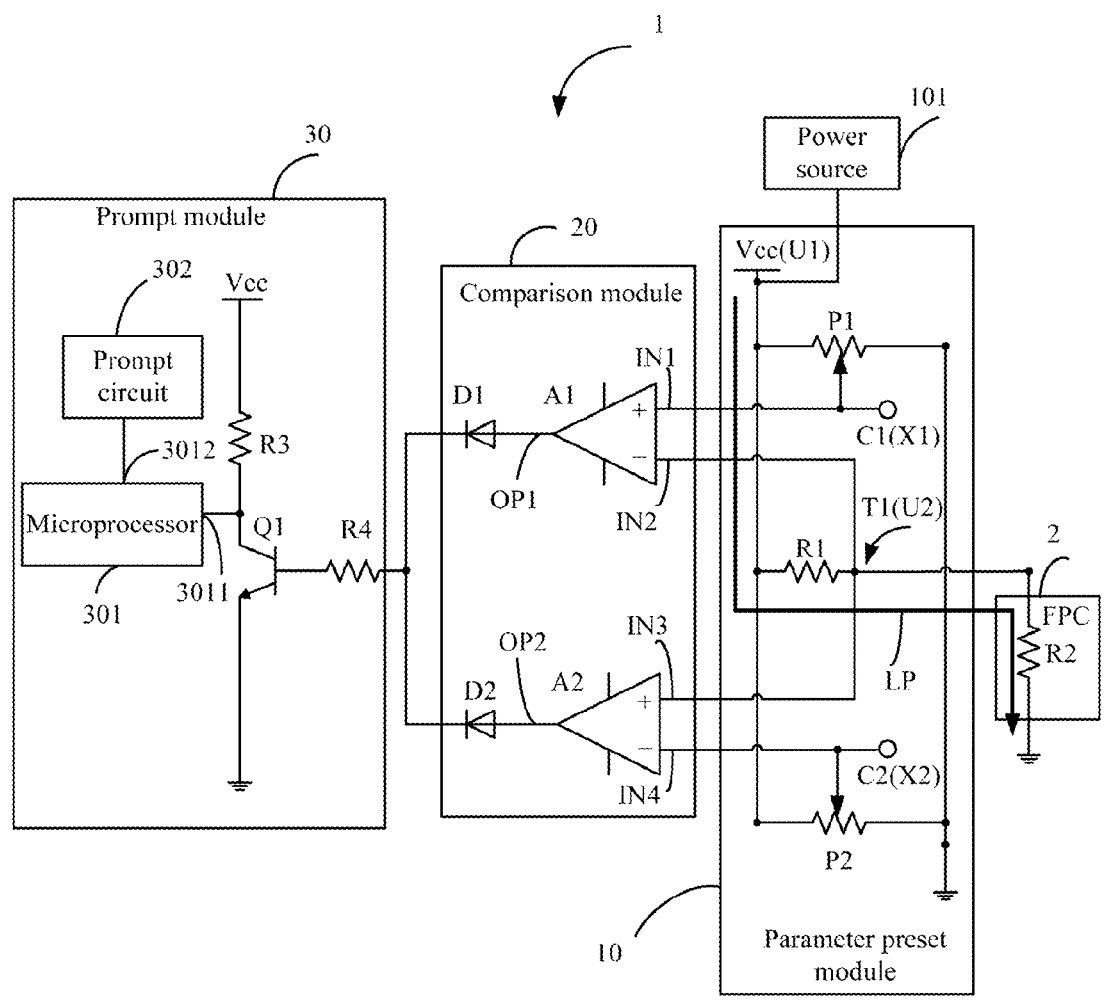
FIG. 2 is a circuit diagram of the test circuit for testing flexible printed circuits of FIG. 1, in accordance with an exemplary embodiment.

Referring to FIG. 2, the parameter preset module 10 includes a power port Vcc, a reference resistor R1, a first potentiometer P1, and a second potentiometer P2. The power port Vcc provides a first voltage U1 by connecting to a power source 101, for example, the power port Vcc is connected to an anode of a battery and obtains the first voltage U1. The first potentiometer P1 and the second potentiometer P2 are connected in parallel between the power port Vcc and ground. A terminal of the reference resistor R1 is connected to the power port Vcc and the other terminal of the reference resistor R1 constitutes an incoming terminal T1 that is connected to the FPC 2. In the embodiment, because the test circuit 1 is used to test the resistance value of the FPC 2, hereinafter, a resistor R2 instead of the FPC 2 is used to illustrate the present disclosure.

The comparison module 20 includes a first comparator A1, a second comparator A2, and two diodes D1 and D2. In the embodiment, the first potentiometer P1 is a three-terminal resistor with a sliding contact C1, the second potentiometer P2 is also a three-terminal resistor with a sliding contact C2. An non-inverting port IN1 of the first comparator A1 is connected to the sliding contact C1 of the first potentiometer P1, an inverting port IN2 of the first comparator A1 is connected to the incoming terminal T1, and an output port OP1 of the first comparator A1 is connected to a positive end of the diode D1. A non-inverting port IN3 of the second comparator A2 is connected to the incoming terminal T1, an inverting port IN4 of the second comparator A2 is connected to the sliding contact C2 of the second potentiometer P2, and an output port OP1 of the second comparator A2 is connected to a positive end of the diode D2.

The prompt module 30 includes a Negative-Positive-Negative bipolar junction transistor (NPN BJT) Q1, a microprocessor 301, and a prompt circuit 302. The base of the NPN BJT Q1 is connected to negative ends (not labeled) of the diode D1 and D2, an emitter of the NPN BJT Q1 is grounded, a collector of the NPN BJT Q1 is electrically connected the power port Vcc via a resistor R3. The collector of the NPN BJT Q1 further connects to an input port 3011 of the microprocessor 301, the microprocessor 301 further includes an output port 3012, which is connected to the prompt circuit 302, the microprocessor 301 controls the prompt circuit to produce corresponding prompt signal according to the state of the NPN BJT Q1.

When the incoming terminal T1 connects to the resistor R2 (the FPC 2), the power port Vcc, the resistor R1, and the resistor R2 form a loop LP1, the incoming terminal T1 has a voltage U2 related to the resistance value of the resistor R2, namely, $U2=U1*R1/(R1+R2)$. Since the voltage of the power port Vcc and the value of the resistor R1 are constant, the voltage U2 is only related to the resistance value of the resistor R2. As the suitable range of the resistance value of the resistor R2 is constant according to the test standard, the suitable range of the voltage U2 can be determined according to the suitable range of the resistance value of the resistor R2. For example, for a FPC 2, if the resistance value of the FPC 2 is within the suitable range, the resistance value of the FPC 2 is accepted, then when the incoming terminal T1 connects to the resistor R2, if the voltage U2 is within a corresponding range, then the resistance value of the FPC 2 is accepted too. For a more detail example, assume the voltage U1 is 5 volt (V). The resistance value of the resistor R1 is 1000 ohm, and the suitable range of the resistance value of the resistor R2 is 1000 ohm~2000 ohm. Then the suitable range of the voltage U2 is $5*1000/(2000+1000)$~$5*1000/(1000+1000)$, namely 1.67 V~2.5 V.

Therefore, before testing the resistance value of the resistor R2, a voltage X1 of the sliding contact C1 and a voltage X2 of the sliding contact C2 can be set to two endpoint value of the suitable range of the voltage U2 determined previously by adjusting the sliding contact C1 and the sliding contact C2. Assume the voltage X1 is lower than the voltage X2, and then the suitable range of the voltage U2 is from X1 to X2. For example, if the suitable rage of the voltage U2 is 1.67 V~2.5

V, then the user can adjust the first potentiometer P1 to set the voltage X1 of the sliding contact C1 as 1.67 V and adjust the second potentiometer P2 to set the voltage X2 of the sliding contact C2 as 2.5 V.

As described above, when the incoming terminal T1 connects to the resistor R2, the power port Vcc, the resistor R1, and the resistor R2 form the loop LP, the voltage U2 of the terminal T1 is equal to U1*R1/(R1+R2), the voltage U2 is the related parameter reflecting the resistance value of the resistor R2. As described above, the sliding contact C1 is connected to the non-inverting input port of the first comparator A1. The sliding contact C2 is connected to the inverting input port of the second comparator A2, and the incoming terminal T1 is connected to the inverting input port of the first comparator A1 and the non-inverting input port of the second comparator A2. The sliding contact C1 and C2 respectively have voltage X1 and X2. When the voltage U2 is higher than the voltage X1 of the sliding contact C1 and is lower than the voltage X2 of the sliding contact C2. Namely, the voltage U2 is within the suitable range, the output ports of the first comparator A1 and the second comparator A2 both output a low voltage signal to the base of the NPN BJT Q1 by the diode D1 and D2. Then the NPN BJT Q1 is turned off accordingly, the input port 3011 of the microprocessor 301 obtains a high voltage from the power port Vcc via the resistor R3. The microprocessor 301 controls the prompt circuit 302 to produce a prompt signal indicating the test has passed when the input port 3011 of the microprocessor 301 is at high voltage. In the embodiment, the prompt circuit 302 is a light-emitting diode (LED), the microprocessor 301 controls the LED to emit green light when the input port 3011 of the microprocessor 301 is at high voltage.

When the voltage U2 is lower than the voltage X1 or is higher than the voltage X2, namely the voltage U2 is out of the suitable range. The output terminal of the first comparator A1 or the output terminal of the second comparator A2 outputs a high voltage signal to the base of the NPN BJT Q1 via the diode D1 or D2, and then the NPN BJT Q1 is accordingly turned on. The input port 3011 of the microprocessor 301 obtains a low voltage from the ground via the NPN BJT Q1, which is turned on, the microprocessor 301 controls the prompt circuit 302 to produce a prompt signal indicating the test has failed when the input port 3011 is at low voltage. For example, the microprocessor 301 controls the LED to emit red light.

In the other embodiment, the prompt circuit 302 is a speaker, the microprocessor 301 controls the prompt circuit 302 to output different audio signal according to the voltage of the input port 3011 of the microprocessor 301.

The test circuit further includes a resistor R4, which is between the base of the NPN BJT Q1 and the negative ends of the diode D1 and D2. The resistor R4 constitutes a base resistor of the NPN BJT Q1.

Figure 3:
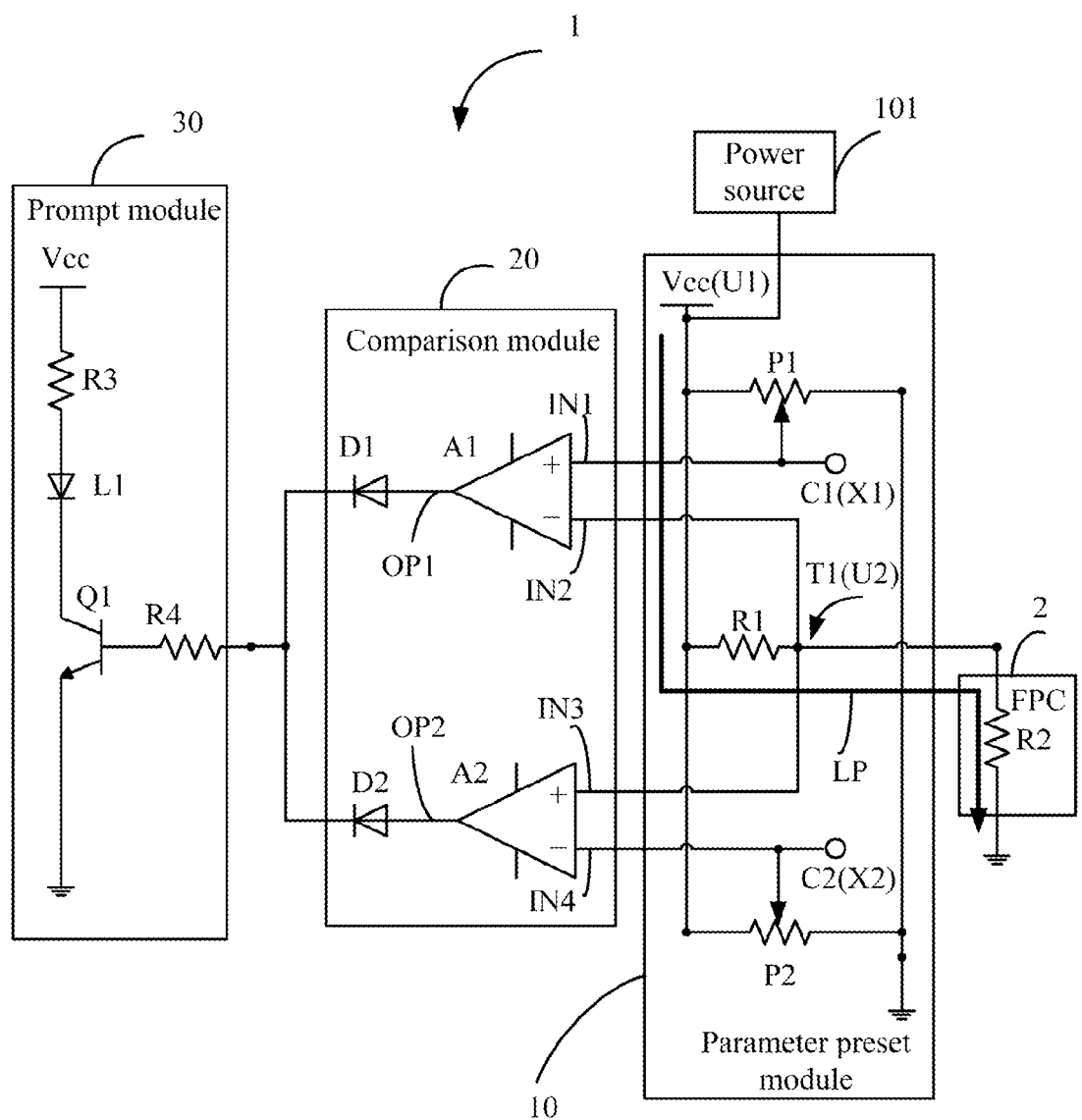
FIG. 3 is a circuit diagram of the test circuit for testing flexible printed circuits of FIG. 1, in accordance with another exemplary embodiment.

FIG. 3 is a circuit diagram of the test circuit 1 in accordance with another exemplary embodiment. Comparing to the previous embodiment, the prompt module 30 only includes the NPN BJT Q1, the resistor R3, and a LED L1. The base of the NPN BJT Q1 is connected to the negative ends of the diode D1 and D2, the emitter of the NPN BJT Q1 is grounded, and the LED L1 and the resistor R3 are connected between the power port Vcc and a collector of the NPN BJT Q1 in series. As described above, when the voltage U2 is higher than the voltage X1 and is lower than voltage X2, the NPN BJT Q1 is turned off, the LED L1 is turned off accordingly and does not emit light, it then prompts that the test has passed. When the voltage U2 is lower than the voltage X1 or is higher than the voltage X2, the NPN BJT Q1 is turned on and the LED L1 is turned on accordingly, the LED L1 emits light such as red light prompts the test has failed.

Therefore, the present disclosure does not test the exact resistance value of the FPC 2, only tests whether the resistance value of the FPC 2 is within the suitable range, which satisfies the need and only needs a simple circuit.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being exemplary embodiments of the present disclosure.

What is claimed is:

1. A test circuit for testing a flexible printed board (FPC), comprising:
a parameter preset module, configured to preset a parameter range indicating a suitable range of the resistance value of the FPC, and further configured to connect to the FPC and convert the resistance value of the FPC to a related parameter, wherein, the parameter preset module comprises a power port, a reference resistor, a first potentiometer, and a second potentiometer, the power port provides a first voltage by connecting to a power source, the first potentiometer and the second potentiometer are connected in parallel between the power port and ground, a terminal of the reference resistor is connected to the power port, and the other terminal of the reference resistor constitutes an incoming terminal for connecting to the FPC;
a comparison module, configured to compare the related parameter with the parameter range, and produce a comparison result; and
a prompt module, configured to produce a corresponding prompt signal according to the comparison result.

2. The test circuit according to claim 1, wherein when the incoming terminal connects to the FPC, the power port, the reference resistor, and the FPC form a loop, and the incoming terminal produces a second voltage which is the related parameter of the PFC.

3. The test circuit according to claim 2, wherein when adjusting the first potentiometer and the second potentiometer, a sliding contact of the first potentiometer has a third voltage and a sliding contact of the second potentiometer has a fourth voltage; the third voltage and the fourth voltage are two endpoint value of the range of the parameter range.

4. The test circuit according to claim 3, wherein the comparison module comprises a first comparator, a second comparator, a first diode, and a second diode, an non-inverting input port, an inverting input port, and an output port of the first comparator are respectively connected to the sliding contact of the first potentiometer, the incoming terminal, and a positive end of the first diode; an non-inverting input port, an inverting input port, and an output port of the second comparator are respectively connected to the incoming terminal, the sliding contact of the second potentiometer, and a positive end of the second diode.

5. The test circuit according to claim 4, wherein the prompt module comprises a Negative-Positive-Negative bipolar junction transistor (NPN BJT), a microprocessor, and a prompt circuit, a base of the NPN BJT is connected to negative ends of the first diode and the second diode, an emitter of the NPN BJT is grounded, a collector of the NPN BJT is electrically connected to the power port via a resistor, and is connected to an input port of the microprocessor; the microprocessor further comprises an output port which is connected to the prompt circuit, the microprocessor is configured to control the prompt circuit to produce different prompt signal according to the voltage of the input port.

6. The test circuit according to claim 5, wherein when the second voltage is between the third voltage and the fourth voltage, the output ports of the first comparator and the second comparator output a low voltage signal to the base of the NPN BJT, which causes the NPN BJT to turn off, the input port of the microprocessor obtains a high voltage from the power port via the resistor, the microprocessor controls the prompt circuit to produce a prompt signal indicating the test is passed.

7. The test circuit according to claim 5, wherein when the second voltage is not between the third voltage and the fourth voltage, the output ports of the first comparator or the second comparator outputs a high voltage signal to the base of the NPN BJT, which causes the NPN BJT to turn on, the input port of the microprocessor obtains a low voltage from the ground via the NPN BJT which is turned on, the microprocessor controls the prompt circuit to produce a prompt signal indicating the test is failed.

8. The test circuit according to claim 5, wherein the prompt circuit is a light-emitting diode (LED), the microprocessor controls the LED to emit light with different color according to the voltage of the input port of the microprocessor.

9. The test circuit according to claim 5, wherein the prompt circuit is a speaker, the microprocessor controls the speaker to produce different audio signal according to the voltage of the input port of it.

10. The test circuit according to claim 4, wherein the prompt module comprises a NPN BJT, a light-emitting light (LED), and a resistor, a base of the NPN BJT is connected to negative ends of the first diode and the second diode, an emitter of the NPN BJT is grounded, and the LED and the resistor is connected between the power port and a collector of the NPN BJT in series.

* * * * *